(12) United States Patent
Ishihara et al.

(10) Patent No.: US 10,422,820 B2
(45) Date of Patent: Sep. 24, 2019

(54) VOLTAGE SENSOR

(71) Applicants: YAZAKI CORPORATION, Tokyo (JP); TOYOTA SCHOOL FOUNDATION, Aichi (JP)

(72) Inventors: Hiroki Ishihara, Shizuoka (JP); Makoto Ishii, Shizuoka (JP); Minoru Sasaki, Aichi (JP)

(73) Assignees: YAZAKI CORPORATION, Tokyo (JP); TOYOTA SCHOOL FOUNDATION, Aichi (JP)

( * ) Notice: Subject to any disclaimer, the term of this patent is extended or adjusted under 35 U.S.C. 154(b) by 0 days.

(21) Appl. No.: 15/724,037

(22) Filed: Oct. 3, 2017

(65) Prior Publication Data
US 2018/0100880 A1  Apr. 12, 2018

(30) Foreign Application Priority Data
Oct. 11, 2016 (JP) .................. 2016-199722

(51) Int. Cl.
*G01R 15/06* (2006.01)
*G01R 19/00* (2006.01)
(Continued)

(52) U.S. Cl.
CPC ........... *G01R 19/0084* (2013.01); *G01R 5/00* (2013.01); *G01R 15/06* (2013.01); *G01R 15/16* (2013.01);
(Continued)

(58) Field of Classification Search
CPC ... G01R 1/203; G01R 15/146; G01R 19/0007
See application file for complete search history.

(56) References Cited

U.S. PATENT DOCUMENTS

2003/0080754 A1  5/2003  Harris et al.
2005/0284222 A1*  12/2005  Johnson ............. G01C 19/5719
                                                     73/504.02
(Continued)

FOREIGN PATENT DOCUMENTS

JP          3-146875 A      6/1991
JP       2005-253187 A      9/2005
(Continued)

OTHER PUBLICATIONS

Japanese Office Action for th related Japanese Patent Application No. 2016-199722 dated Oct. 30, 2018.
(Continued)

*Primary Examiner* — Tung X Nguyen
(74) *Attorney, Agent, or Firm* — Kenealy Vaidya LLP

(57) ABSTRACT

A voltage sensor includes a vibrator configured to be supported by a mechanical supporting portion and to be given a floating potential, a drive electrode configured to be disposed adjacent to the vibrator and to resonate the vibrator with applied AC voltage, a driver configured to apply an AC voltage that crosses 0 V to the drive electrode, a fixed electrode configured to be disposed adjacent to the vibrator with a gap formed between the fixed electrode and the vibrator, and a calculator configured to detect a magnitude of a measurement target voltage based on a change of a resonant frequency of the vibrator when the measurement target voltage is applied to the fixed electrode.

6 Claims, 8 Drawing Sheets

(51) Int. Cl.
*G01R 15/16* (2006.01)
*G01R 15/24* (2006.01)
*G01R 21/06* (2006.01)
*G01R 5/00* (2006.01)

(52) U.S. Cl.
CPC .......... *G01R 15/242* (2013.01); *G01R 21/06* (2013.01); *G01R 15/24* (2013.01)

(56) References Cited

U.S. PATENT DOCUMENTS

| | | |
|---|---|---|
| 2009/0057792 A1 | 3/2009 | Steeneken et al. |
| 2009/0244677 A1 | 10/2009 | Mizukami et al. |
| 2010/0026136 A1 | 2/2010 | Gaidarzhy et al. |
| 2013/0298670 A1* | 11/2013 | Tsugai ................... G01C 19/56 73/504.12 |

FOREIGN PATENT DOCUMENTS

| | | |
|---|---|---|
| JP | 2008-52270 A | 3/2008 |
| JP | 2008-66800 A | 3/2008 |
| JP | 2008-99020 A | 4/2008 |
| JP | 2008-526079 A | 7/2008 |
| JP | 2013-64667 A | 4/2013 |
| JP | 2013-160990 A | 8/2013 |
| JP | 2013-228367 A | 11/2013 |
| JP | 2016-65817 A | 4/2016 |

OTHER PUBLICATIONS

Japanese Office Action for th related Japanese Patent Application No. 2016-199722 dated Mar. 5, 2019.

* cited by examiner

HALT PERIOD

HALT PERIOD

FIG.10

| AC VOLTAGE (AMPLITUDE: 30V) | TIME AVERAGE (AREA DIFFERENCE) OF WAVEFORM OF AC VOLTAGE | STANDARD VARIATION OF RESONANCE FREQUENCY |
|---|---|---|
| OFFSET VOLTAGE: 0 V | 0.00 | 0.00019kHz |
| OFFSET VOLTAGE: 10 V | 0.33 | 0.00090kHz |
| OFFSET VOLTAGE: 20 V | 0.67 | 0.00162kHz |
| OFFSET VOLTAGE: 30 V | 1.00 | 0.00233kHz |

VOLTAGE SENSOR

CROSS REFERENCE TO RELATED APPLICATIONS

This application is based on Japanese Patent Application (No. 2016-199722) filed on Oct. 11, 2016, the contents of which are incorporated herein by reference.

BACKGROUND OF THE INVENTION

1. Field of the Invention

The present invention relates to a voltage sensor.

2. Description of the Related Art

A voltage sensor is known which is equipped with a Pockels element, a quarter-wave plate, a polarizer, an analyzer, etc. (refer to JP-A-3-146875, for example). In this voltage sensor, an optical signal that is output from a light source is polarized by the polarizer and enters the Pockels element, where the optical signal is modulated optically according to the magnitude of a voltage. The modulated optical signal is transmitted to the analyzer via the quarter-wave plate. The optical signal that is output from the analyzer is received and detected by a prescribed optical receiver. The voltage applied to the Pockels element can be detected in this manner.

However, the voltage sensor disclosed in JP-A-3-146875 has a problem that it requires a large number of components, that is, the Pockels element, the quarter-wave plate, the polarizer, the analyzer, and other components. Furthermore, it requires complicated assembling work because optical axis alignment etc. need to be carried out.

In view of the above, another type of voltage sensor has been proposed which is equipped with a vibrator that is supported a mechanical suspension and a fixed electrode that is opposed to the vibrator with a certain gap formed between them (refer to JP-A-2013-228367). When a voltage to be measured is applied to the fixed electrode, an electrostatic attractive force acts on the vibrator to change its resonant frequency. The measurement target voltage can thus be calculated.

In this voltage sensor, when a voltage to be measured is applied to the fixed electrode, a resulting electrostatic attractive force changes the spring constant of the suspension substantially, as a result of which the resonant frequency of the vibrator is changed. Since this change has a certain correlation with the magnitude of the measurement target voltage, the measurement target voltage can be measured on the basis of the resonant frequency thus changed. Not requiring the above-mentioned optical components, the voltage sensor disclosed in JP-A-2013-228367 is small in the number of components. Furthermore, since optical axis alignment etc. are not necessary, assembling work is not very complex.

In the voltage sensor disclosed in JP-A-2013-228367, an AC voltage that is applied to a drive electrode to vibrate the vibrator is given a positive DC bias voltage. This measure is employed taking into consideration the vibration efficiency in a case that the vibrator is regarded as a vibration actuator, because the vibrator is given a floating potential.

However, in the voltage sensor disclosed in JP-A-2013-228367, since the AC voltage that is applied to the drive electrode is given the positive DC bias voltage so that the total voltage is kept positive even when the AC voltage takes a bottom value, the vibrator is charged up being placed in an electric field that has a single polarity in one direction all the time, whereby the effective electric field applied to the vibrator is varied. This affects its resonant frequency and thereby increases a fluctuation or a drift of measurement results.

This problem is not limited to the case of an AC voltage that is given a positive DC bias voltage so that the total voltage is kept positive even when the AC voltage takes a bottom value, but arises also in the case of an AC voltage that is given a negative DC bias voltage so that the total voltage is kept negative even when the AC voltage takes a top value.

SUMMARY OF THE INVENTION

The present invention has been made to solve the above problem of the related art, and an object of the present invention is therefore to provide a voltage sensor capable of reducing the fluctuation or the drift of measurement results while preventing increase of the number of components and complication of assembling work.

The invention provides a voltage sensor comprising:
a vibrator configured to be supported by a mechanical supporting portion and to be given a floating potential;
a drive electrode configured to be disposed adjacent to the vibrator and to resonate the vibrator with applied AC voltage;
a driver configured to apply an AC voltage that crosses 0 V to the drive electrode; and
a fixed electrode configured to be disposed adjacent to the vibrator with a gap formed between the fixed electrode and the vibrator;
a calculator configured to detect a magnitude of a measurement target voltage based on a change of a resonant frequency of the vibrator when the measurement target voltage is applied to the fixed electrode.

According to the voltage sensor, since the AC voltage that crosses 0 V is applied to the drive electrode, the vibrator is not placed in an electric field that has a single polarity in one direction all the time. Thus, the phenomenon that the effective field applied to the vibrator is varied due to charging-up of the vibrator can be suppressed, and hence its influence on the resonant frequency can be prevented. Furthermore, since a Pockels element, a quarter-wave plate, a polarizer, an analyzer, and other components are not necessary and optical axis alignment etc. are not required as components of the voltage sensor, increase of the number of components and complication of assembling work can be prevented. In conclusion, it becomes possible to reduce a fluctuation or a drift of measurement results while preventing increase of the number of components and complication of assembling work.

In the above voltage sensor, for example, the driver applies, to the drive electrode, an AC voltage that is kept at 0 V every time the AC voltage reaches 0 V for a prescribed period starting from a time when the AC voltage reaches 0 V.

In this voltage sensor, since the AC voltage is kept at 0 V every time it reaches 0 V for a prescribed period starting from a time when it reaches 0 V, the degree of charging-up of the vibrator is further lowered and hence a fluctuation or a drift of measurement results can be reduced further.

In the above voltage sensor, for example, the driver applies, to the drive electrode, an AC voltage whose time average over one cycle is approximately equal to 0 V.

In this voltage sensor, since the AC voltage whose time average is approximately equal to 0 V is applied to the drive electrode, a variation of the effective electric field applied to the vibrator due to charging-up of the vibrator and hence its influence on the resonant frequency can be suppressed further. As a result, a fluctuation or a drift of measurement results can be reduced further.

The invention can provide a voltage sensor capable of reducing the fluctuation or the drift of measurement results while preventing increase of the number of components and complication of assembling work.

BRIEF DESCRIPTION OF THE DRAWINGS

FIG. 10 is a table showing standard deviations of the resonant frequency in the cases of AC voltages (having amplitude: 30 V) with an offset voltage 10 V or 20 V as well as the standard deviations in the cases of the AC voltages (having amplitude: 30 V) with an offset voltage 0 V or 30 V.

DETAILED DESCRIPTION OF THE EXEMPLARY EMBODIMENTS

Although a preferred embodiment of the present invention will be described below with reference to the drawings, the invention is not limited to the following embodiment.

Figure 1:
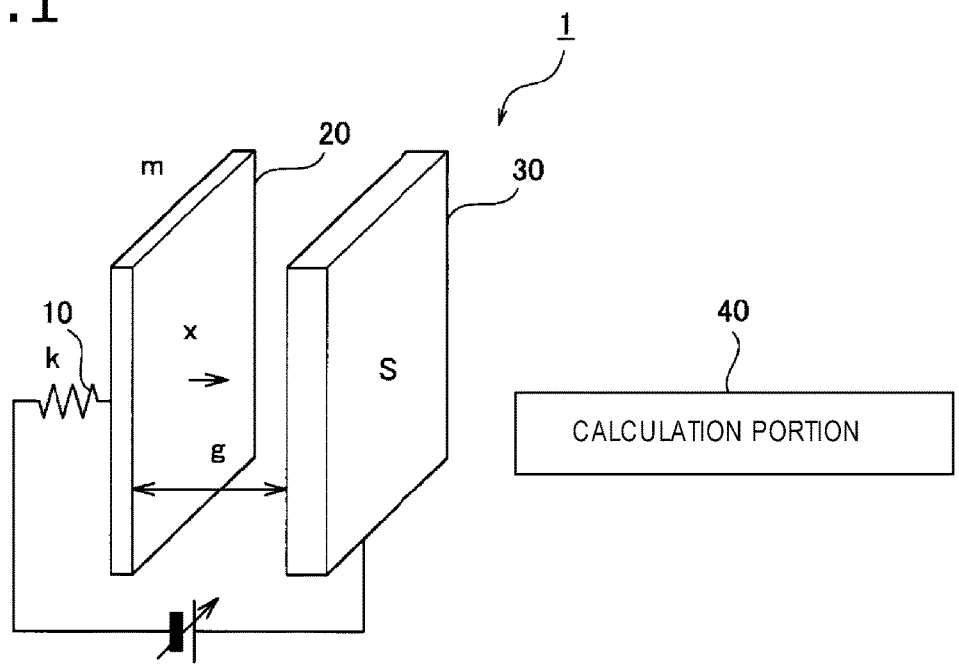
FIG. 1 shows a basic configuration and the principle of operation of a voltage sensor according to an embodiment of the invention.

FIG. 1 shows a basic configuration and the principle of operation of a voltage sensor 1 according to the embodiment of the invention. As shown in FIG. 1, the voltage sensor 1 according to the embodiment includes a mechanical suspension (supporting portion) 10, a vibrator 20, a fixed electrode 30, and a calculation portion 40.

The suspension 10 supports the vibrator 20. The spring coefficient of the suspension 10 is represented by k. The vibrator 20 is a flat-plate electrode supported by the suspension 10 and can be vibrated because of the elasticity force of the suspension 10. The mass of the vibrator 20 is represented by m.

The fixed electrode 30 is a flat-plate electrode that is opposed to the vibrator 20 with a prescribed gap formed between them, and the fixed electrode 30 and the vibrator 20 constitute parallel-plate electrodes. The area of the opposed surfaces of the vibrator 20 and the fixed electrode 30 is represented by S, and their initial gap is represented by g.

When an AC voltage is applied to a drive electrode 50 (hereinafter described) of the voltage sensor 1, the vibrator 20, being suspended by the suspension 10, is vibrated in the direction in which the distance between the vibrator 20 and the fixed electrode 30 is increased and decreased (the left-right direction in FIG. 1). The vibrator 20 vibrates with the amplified displacement at a resonant frequency $f_r$ that is given by the following Equation (1):

[Formula 1]

$$f_r = \frac{1}{2\pi}\sqrt{\frac{k}{m}} \qquad (1)$$

A measurement target voltage $V_m$ is further applied to the fixed electrode 30. In response, an electrostatic attractive force acts on the vibrator 20 from the fixed electrode 30, whereby the position of the vibrator 20 is changed by x. The electrostatic attractive force can be expressed as an equivalent spring constant $k_e$ that is given by the following Equation (2):

[Formula 2]

$$k_e = \frac{\varepsilon_0 S V^2}{(g-x)^3} \qquad (2)$$

where $\varepsilon_0$ is the permittivity of the gap g and $V_m$ is the measurement target voltage.

As a result, the vibrator 20 vibrates at a resonant frequency $f_r'$ that is given by the following Equation (3):

[Formula 3]

$$f_r' = \frac{1}{2\pi}\sqrt{\frac{k-k_s}{m}}. \qquad (3)$$

Since the equivalent spring constant $k_e$ which is given by Equation (2) varies depending on the magnitude of the voltage $V_m$ which is applied to the fixed electrode 30, the resonant frequency $f_r'$ in Equation (3) reflects the magnitude of the voltage $V_m$.

Thus, the calculation portion 40 can calculate the magnitude of the measurement target voltage $V_m$ from the resonant frequency $f_r'$ of the vibrator 20.

Figure 2:
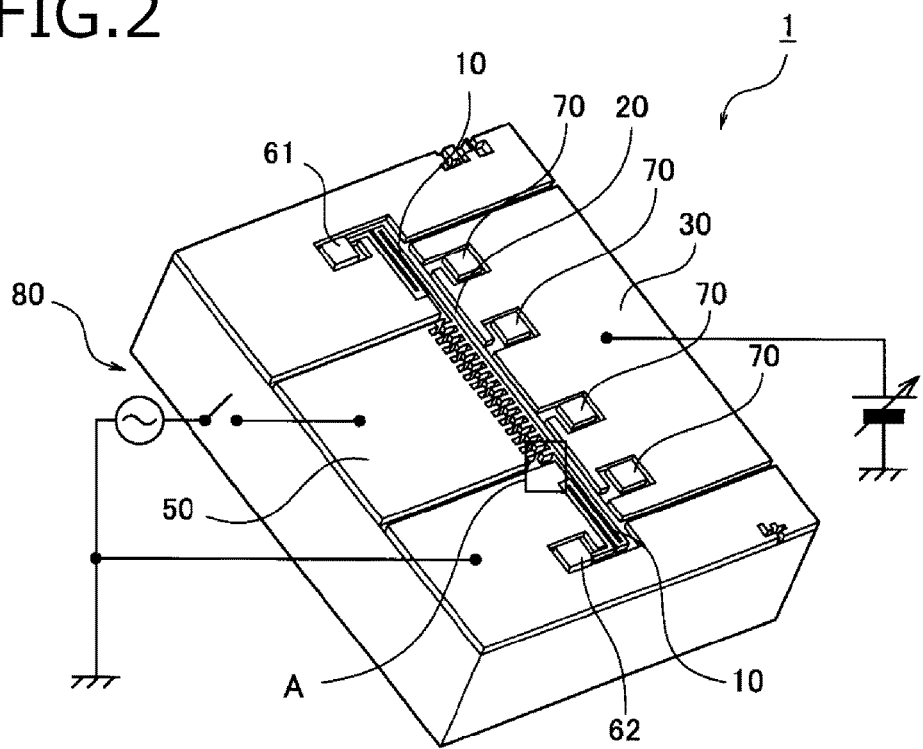
FIG. 2 is a perspective view of the voltage sensor according to the embodiment.

FIG. 2 is a perspective view of the voltage sensor 1 according to the embodiment. As shown in FIG. 2, the voltage sensor 1 is a micro voltage sensor that is manufactured using a MEMS (micro-electro-mechanical systems) processing technique.

In the voltage sensor 1 shown in FIG. 2, to increase the resonant frequency of the vibrator 20 by decreasing its mass, the vibrator 20 has a long and narrow shape. The suspensions 10 are attached to the two respective ends of the long and narrow vibrator 20 and thus support the vibrator 20 from the sides of its two ends. Each suspension 10 is folded back so as to assume a U shape. Supported by these two suspensions 10, the vibrator 20 is given a floating potential.

As shown in FIG. 2, the voltage sensor 1 includes not only the components shown in FIG. 1 but also the drive electrode 50, a first electrode 61 and a second electrode 62 which are connected to the ends, opposite to the ends connected to the vibrator 20, of the suspensions 10, respectively, and stoppers 70. The calculation portion 40 shown in FIG. 1 is connected to at least one of the first electrode 61 and the second electrode 62.

Figure 3:
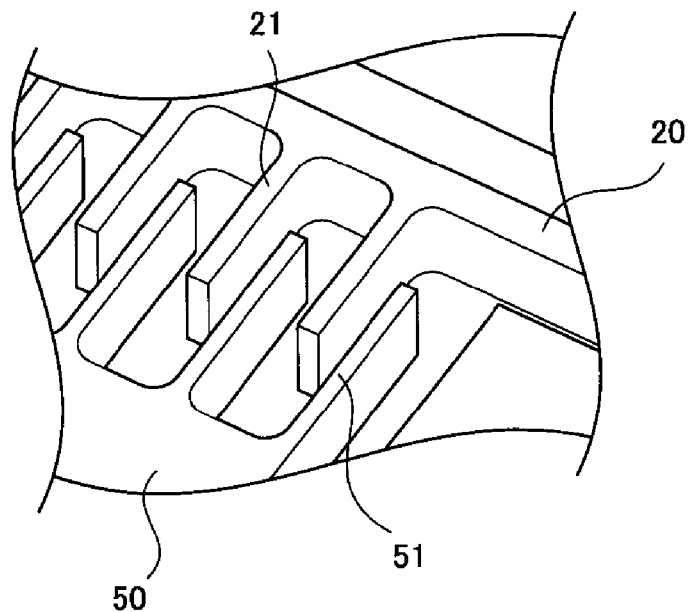
FIG. 3 is an enlarged view of part A of FIG. 2.

The drive electrode 50 is disposed adjacent to the vibrator 20. When an AC voltage is applied to the drive electrode 50, the drive electrode 50 excites and vibrates the vibrator 20 to cause it to resonate. FIG. 3 is an enlarged view of part A of FIG. 2. As shown in FIG. 3, the drive electrode 50 has comb tooth electrodes 51 which extend toward the vibrator 20. Likewise, the vibrator 20 shown in FIG. 2 has comb tooth electrodes 21 which extend toward the drive electrode 50. The comb tooth electrodes 21 and 51 are arranged alternately so as not to be in contact with each other.

The voltage sensor 1 shown in FIG. 2 can be manufactured by processing an SOI (Silicon-On-Insulator) wafer, for example. More specifically, single-mask patterning and Deep RIE (Reactive Ion Etching) are performed. The vibrator 20 which is a movable component is released by sacrificial layer etching using vapor HF.

To be able to vibrate, the vibrator 20 is floated being supported by the suspensions 10 in the manner described above. In an actual product in which dimensions x, y, and z of a device layer are 1,125 μm, 1,585 μm, and 25 μm, respectively, the vibrator 20 sinks with respect to the other electrodes 30 and 50 by a maximum of 66 nm. However, since the sinking distance is as short as 1/30 of the thickness 2 μm of a sacrificial layer, the vibrator 20 does not come into contact with a handle layer. Although because of the way FIG. 2 is drown the comb tooth electrodes 51 and the fixed electrode 30 may look as if they were also floated, this is because of progress of sacrificial layer etching in partial regions. In actuality, they are fixed to the handle layer.

Figure 4:
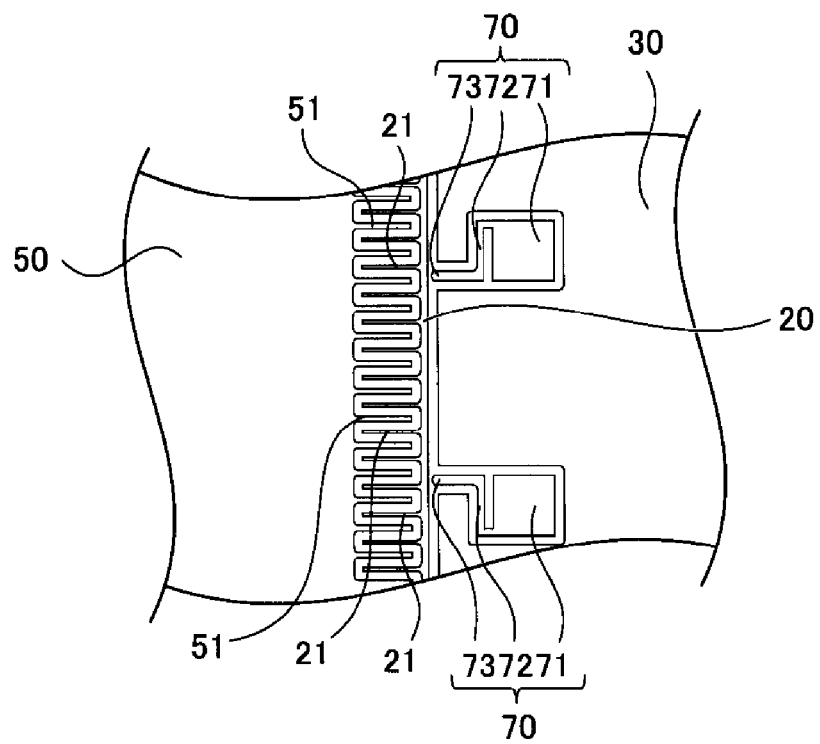
FIG. 4 is an enlarged top view of part of the voltage sensor 1 shown in FIG. 2.

FIG. 4 is an enlarged top view of part of the voltage sensor 1 shown in FIG. 2. As seen from FIGS. 2 and 4, the four stoppers 70 are formed beside the vibrator 20, that is, on the side of the fixed electrode 30 (only two stoppers 70 are shown in FIG. 4). The stoppers 70 are floating electrodes; they are not connected electrically to any member. Each stopper 70 has a main body 71, a spring portion 72, and a contact portion 73.

The main body 71 is approximately shaped like a square in a top view, and the spring portion 72 which is long and narrow extends from one apex of the approximately square main body 71. A tip portion of the spring portion 72 projects slightly to the vibrator 20 side beyond the edge of the fixed electrode 30. The spring portion 72 is formed in such a manner as to project toward the vibrator 20 side from the apex of the approximately square main body 71, then be bent by 90° to extend alongside the edge of the main body 71, and be bent again by 90° toward the vibrator 20 side. That is, the spring portion 72 is bent by 90° two times and thereby given elasticity.

Because of the presence of the stoppers 70 having the above structure, even if the vibrator 20 is pulled excessively toward the fixed electrode 30 side by an electrostatic attractive force, the vibrator 20 comes into contact with the contact portions 73 and hence is prevented from being short-circuited with the fixed electrode 30. Even if the vibrator 20 comes into contact with the stoppers 70, resulting impact is reduced by the elasticity of the spring portions 72, whereby the degrees of bending of the contact portions 73 are reduced or they are prevented completely from being bent.

Next, a description will be made of how the voltage sensor 1 according to the embodiment operates. First, in the voltage sensor 1, an AC voltage is applied to the drive electrode 50, whereby an electrostatic attractive force is generated. With the AC voltage supplied to the drive electrode 50, the vibrator 20 vibrates at the prescribed resonant frequency $f_r$.

In this state, a measurement target voltage Vm is applied to the fixed electrode 30. As a result, an electrostatic attractive force that is given by Equation (2) is generated and the vibrator 20 comes to vibrate at a resonant frequency $f_r'$ that is given by Equation (3).

The calculation portion 40 calculates the magnitude of the measurement target voltage Vm from the resonant frequency $f_r'$. To measure the resonant frequency $f_r'$, the calculation portion 40 needs to measure a displacement of the vibrator 20. More specifically, in the voltage sensor 1, laser light is shone on the vibrator 20 and a displacement of the vibrator 20 is determined from a deflection width of reflection light (optical measurement).

Alternatively, in the voltage sensor 1, a displacement of the vibrator 20 may be measured from a capacitance variation that is caused by a variation of the electrode gap g (electrical measurement). A displacement of the vibrator 20 may be measured from a capacitance variation by either using the fixed electrode 30 as it is or disposing another parallel plate electrode dedicated to the displacement measurement.

In the voltage sensor 1 according to the embodiment, a drive circuit (driver) 80 is connected to the drive electrode 50. The drive circuit 80 applies, to the drive electrode 50, an AC voltage for causing the vibrator 20 to resonate. In particular, in the embodiment, the drive circuit 80 applies, to the drive electrode 50, an AC voltage that crosses 0 V, more preferably, an AC voltage whose time average (over one cycle) is approximately equal to 0 V.

Figure 5A:
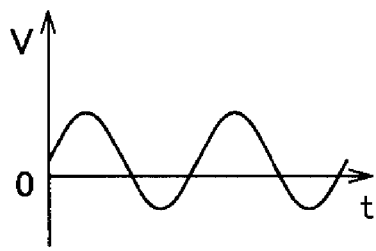
FIGS. 5A-5D show first to fourth examples, respectively, of the AC voltage that a drive circuit applies to a drive electrode.

FIGS. 5A-5D show first to fourth examples, respectively, of the AC voltage that the drive circuit 80 applies to the drive electrode 50. As shown in FIG. 5A, the first example AC voltage crosses 0 V and is given a prescribed positive (or negative) DC bias voltage. Thus, the time average of this example AC voltage is not approximately equal to 0 V.

Figure 5B:
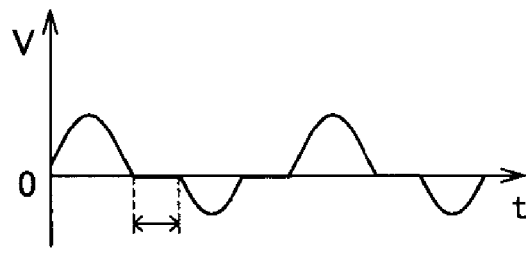

As shown in FIG. 5B, the second example AC voltage is such as to be kept at 0 V every time it reaches 0 V for a prescribed period starting from the time when it reaches 0 V. That is, this example AC voltage has 0-V halt periods.

Figure 5C:
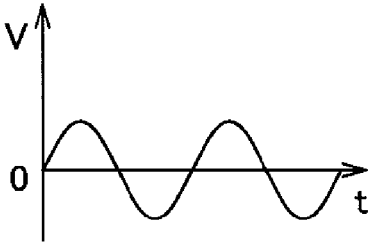

As shown in FIG. 5C, the third example AC voltage has positive portions and negative portions that are the same in amplitude, instead of being given a positive or negative DC bias voltage.

Figure 5D:
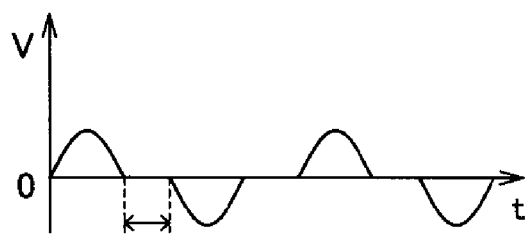

As shown in FIG. 5D, the fourth example AC voltage has not only positive portions and negative portions that are the same in amplitude but also 0-V halt periods. That is, this example AC voltage is a combination of the second example (FIG. 5B) and the third example (FIG. 5C).

By applying such an AC voltage to the drive electrode 50, the variation of the effective electric field applied to the vibrator 20 due to charging-up of the vibrator 20 and its resulting influence on the resonant frequency can be suppressed.

Figure 6:
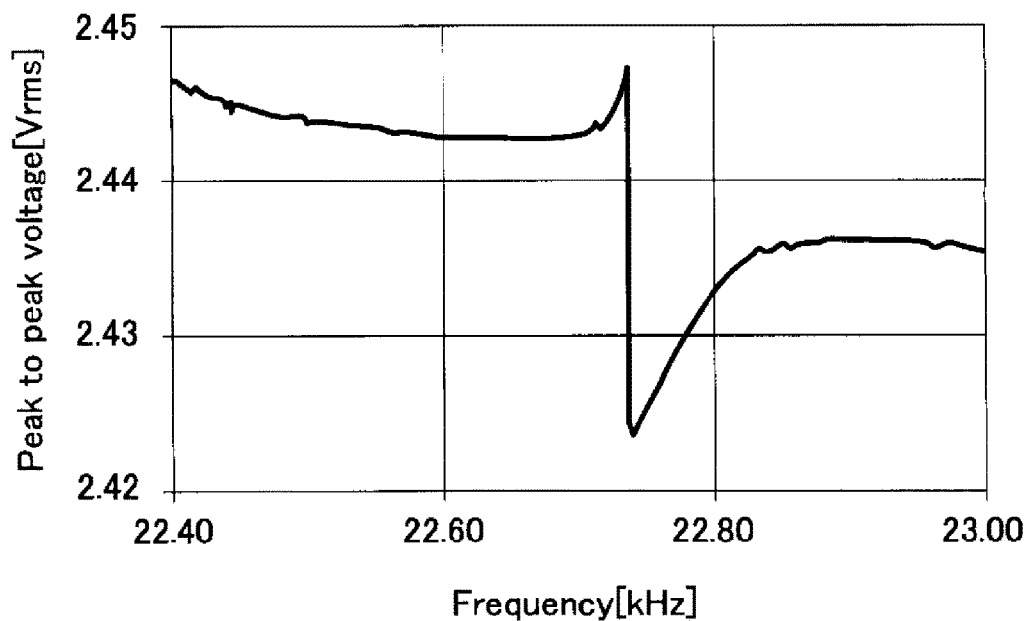
FIG. 6 is a graph showing how a signal varies with respect to the frequency in the voltage sensor shown in FIG. 2.

FIG. 6 is a graph showing how a signal varies with respect to the frequency in the voltage sensor 1 shown in FIG. 2. For example, an AC voltage as shown in FIG. 5C was applied to the drive electrode 50 and a resulting signal generated from the vibrator 20 was detected. As the frequency was varied, as shown in FIG. 6 a steep signal variation occurred at 22.73 kHz (resonant frequency).

As described later with reference to FIG. 8, the frequency (resonant frequency) at which a signal variation as mentioned above occurred decreased monotonously as the voltage Vm applied to the fixed electrode 30 was increased. This indicates that the voltage sensor 1 is sufficiently usable as a voltage sensor.

Figure 7:
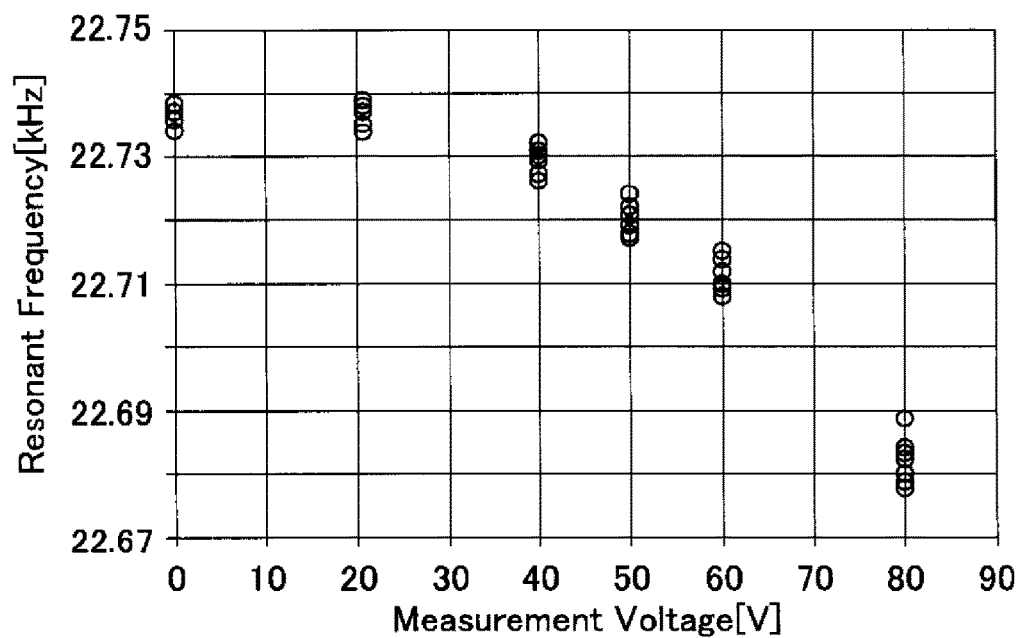
FIG. 7 is a graph showing a correlation between the voltage applied to a fixed electrode and the resonant frequency in a case that an AC voltage (0 to 60 V) that was given a positive DC bias voltage was applied to a drive electrode.

FIG. 7 is a graph showing a correlation between the voltage Vm applied to the fixed electrode 30 and the resonant frequency in a case that an AC voltage (0 to 60 V) that was given a positive DC bias was applied to the drive electrode 50. This AC voltage is called an "AC voltage with an offset voltage 30 V."

Figure 8:
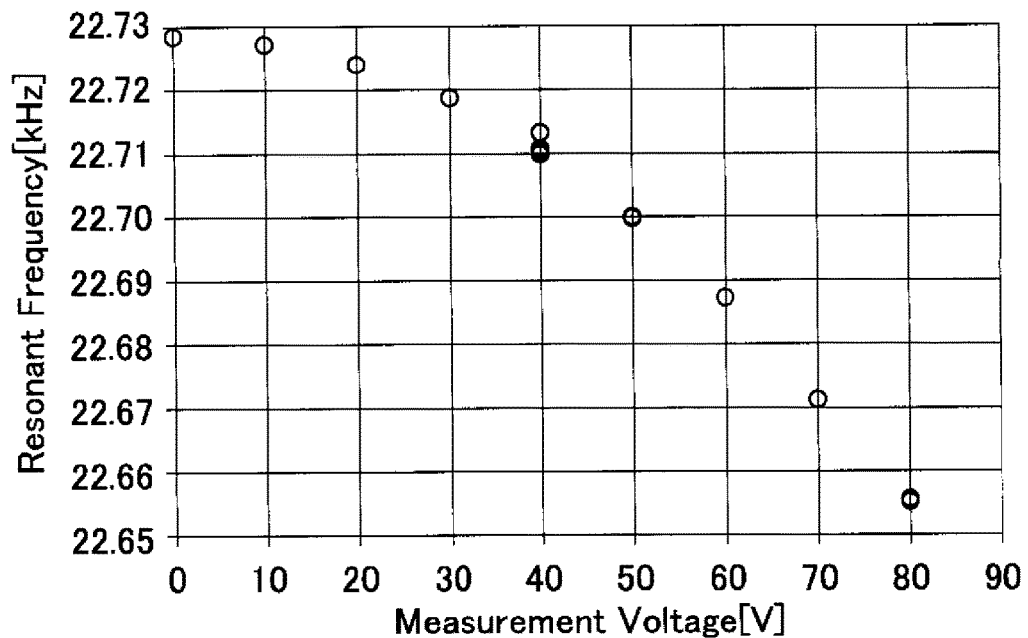
FIG. 8 is a graph showing a correlation between the voltage applied to the fixed electrode and the resonant frequency in a case that an AC voltage (−30 to 30 V) having positive portions and negative portions that were the same in amplitude (i.e., the time average was 0 V) was applied to the drive electrode.

Likewise, FIG. 8 is a graph showing a correlation between the voltage Vm applied to the fixed electrode 30 and the resonant frequency in a case that an AC voltage (−30 to 30 V) having positive portions and negative portions that were the same in amplitude (i.e., the time average was 0 V) was applied to the drive electrode 50. This AC voltage is called an "AC voltage with an offset voltage 0 V."

In the graphs shown in FIGS. 7 and 8, a resonant frequency was measured 10 times for each of voltages Vm applied to the fixed electrode 30 which were 0 V, 20 V, 40 V, 50 V, 60 V, and 80 V. Resonance frequencies were measured by the above-described electrical measuring method.

As seen from FIG. 7, in the case where the AC voltage with an offset voltage 30 V was applied to the drive electrode 50, a measurement result variation of about 0.005 to 0.013 kHz occurred in each of the cases that the voltage Vm applied to the fixed electrode 30 was 0 V, 20 V, 40 V, 50 V, 60 V, and 80 V.

In contrast, as seen from FIG. 8, in the case where the AC voltage with an offset voltage 0 V was applied to the drive electrode 50, a measurement result variation of about 0.003 kHz occurred when the voltage Vm applied to the fixed electrode 30 was 40 V. However, almost no measurement result variation was found in each of the other cases that the voltage Vm was 0 V, 20 V, 50 V, 60 V, and 80 V.

Figure 9:
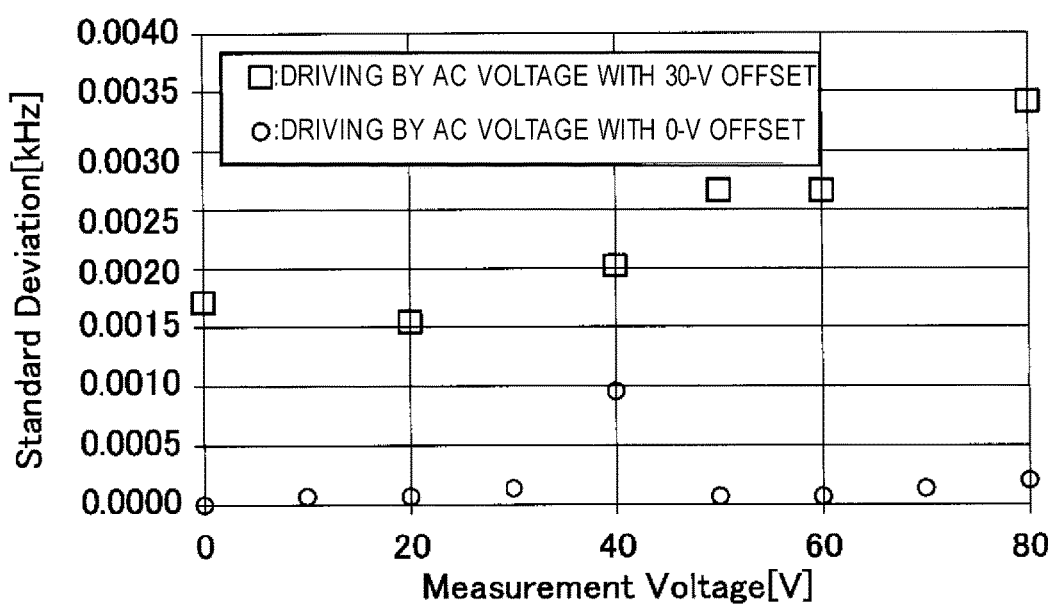
FIG. 9 is a graph showing a correlation between the voltage applied to the fixed electrode and the standard deviation of the resonant frequency in both of the case that the AC voltage with an offset voltage 30 V was applied to the drive electrode 50 and the case that the AC voltage with an offset voltage 0 V was applied to the drive electrode.

FIG. 9 is a graph showing a correlation between the voltage Vm applied to the fixed electrode 30 and the standard deviation of the resonant frequency in both of the case that the AC voltage with an offset voltage 30 V was applied to the drive electrode 50 and the case that the AC voltage with an offset voltage 0 V was applied to the drive electrode 50.

As seen from FIG. 9, in the case where the AC voltage with an offset voltage 30 V was applied to the drive electrode 50, the standard deviation was larger than or equal to 0.0015 kHz in each of the cases that the voltage Vm applied to the fixed electrode 30 was 0 V, 20 V, 40V, 50 V, 60 V, and 80 V. In particular, when the voltage Vm was 80 V, the standard deviation was equal to a little lower than 0.0035 kHz. The average of the standard deviations that were obtained in the case where the AC voltage with a positive DC bias voltage was applied to the drive electrode 50 was equal to 0.00233 kHz.

On the other hand, in the case where the AC voltage with an offset voltage 0 V was applied to the drive electrode 50, the standard deviation was a little lower than 0.0010 kHz when the voltage Vm applied to the fixed electrode 30 was 40 V. However, the standard deviation was lower than 0.0002 kHz in each of the other cases that the voltage Vm was 0 V, 20 V, 50 V, 60 V, and 80 V. The average of the standard deviations that were obtained in the case where the AC voltage having positive and negative portions and a time average 0 V was applied to the drive electrode 50 was equal to 0.00019 kHz.

As described above, the average of the standard deviations that were obtained in the case where the AC voltage with an offset voltage 0 V was applied to the drive electrode 50 was smaller than 1/10 of the average of the standard deviations that were obtained in the case where the AC voltage with an offset voltage 30 V was applied to the drive electrode 50; that is, the measurement result variations were much smaller in the former case.

It is expected that also in the cases of AC voltages (having amplitude: 30 V) with an offset voltage 10 V or 20 V the standard deviation and hence the measurement result variation would be smaller than in the case of the AC voltage with an offset voltage 30 V.

FIG. 10 is a table showing standard deviations in the cases of the AC voltages (having amplitude: 30 V) with an offset voltage 10 V or 20 V as well as the standard deviations in the cases of the AC voltages (having amplitude: 30 V) with an offset voltage 0 V or 30 V. FIGS. 11A-11D illustrate a method for calculating standard deviations in the cases of the offset voltages 10 V and 20 V, and show waveforms of the AC voltages (having amplitude: 30 V) with the offset voltages 30 V, 20V, 10 V, and 0 V, respectively.

Figure 11A:
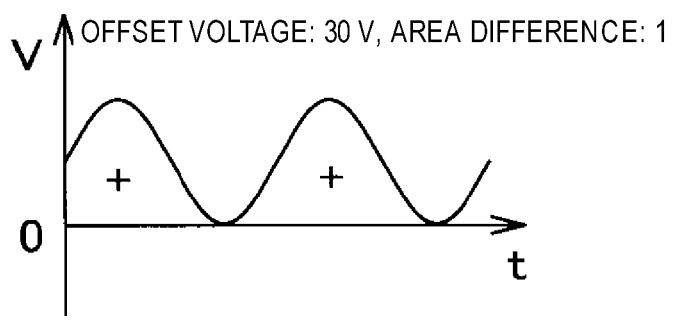
FIGS. 11A-11D illustrate a method for calculating standard deviations in the cases of the offset voltages 10 V and 20 V, and show waveforms of the AC voltages with the offset voltages 30 V, 20 V, 10 V, and 0 V, respectively.

First, as shown in FIG. 11A, an area obtained by subtracting the area of a portion where the voltage is lower than 0 V (there is no such portion in this waveform) from the area of a portion (indicated by symbol "+" in FIG. 11A) where the voltage is higher than 0 V is assumed to be "1." In this case, as shown in FIG. 10, the standard deviation of the resonant frequency is equal to 0.00233 kHz.

Figure 11B:
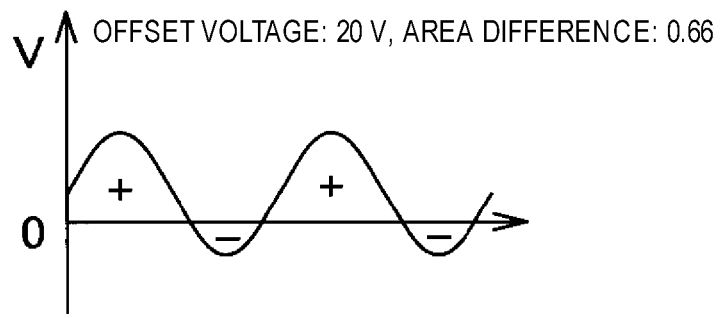
Figure 11C:
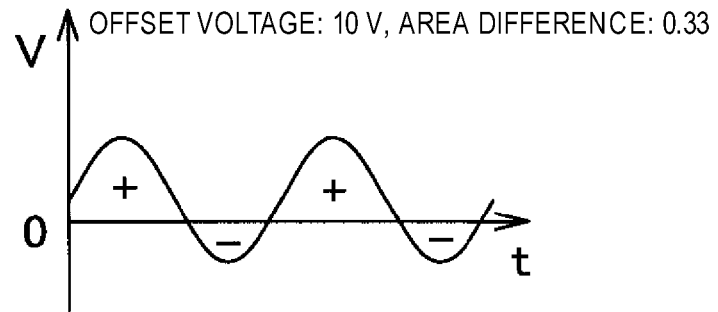
Figure 11D:
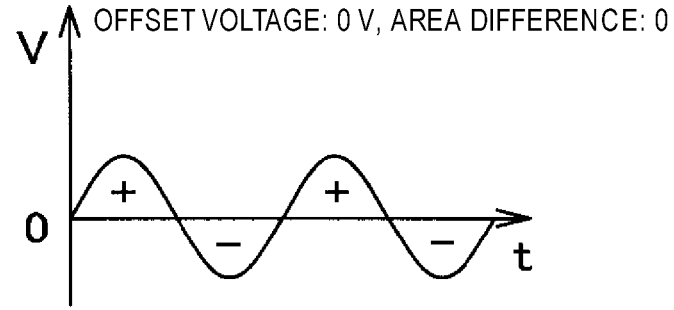

As shown in FIG. 11D, an area obtained by subtracting the area of a portion (indicated by symbol "−" in FIG. 11D) where the voltage is lower than 0 V from the area of a portion (indicated by symbol "+" in FIG. 11D) where the voltage is higher than 0 V is equal to "0." In this case, as shown in FIG. 10, the standard deviation of the resonant frequency is equal to 0.00019 kHz.

Standard deviations in the cases of the offset voltages 10 V and 20 V are calculated as described below on the basis of the above data according to area ratios. In the case of the offset voltage 20 V, an area obtained by subtracting the area of a portion (indicated by symbol "−" in FIG. 11B) where the voltage is lower than 0 V from the area of a portion (indicated by symbol "+" in FIG. 11B) where the voltage is higher than 0 V is equal to "0.66" because the area subtraction result obtained in the case of the offset voltage 30 V (FIG. 11A) is assumed to be "1." Thus, it can be said that the standard deviation of the resonant frequency of this case is 0.00162 kHz (this value is written in FIG. 10) according to this area ratio.

In the case of the offset voltage 10 V, an area obtained by subtracting the area of a portion (indicated by symbol "−" in FIG. 11C) where the voltage is lower than 0 V from the area of a portion (indicated by symbol "+" in FIG. 11C) where the voltage is higher than 0 V is equal to "0.33" because the area subtraction result obtained in the case of the offset voltage 30 V (FIG. 11A) is assumed to be "1." Thus, it can be said that the standard deviation of the resonant frequency of this case is 0.00090 kHz (this value is written in FIG. 10) according to this area ratio.

As described above, it can be said that also in the cases of FIGS. 11B and 11C the resonant frequency variation can be made smaller than in the case of FIG. 11A. That is, whereas the case is advantageous that an AC voltage whose time average is equal to 0 V is applied to the drive electrode 50, it can be said that certain levels of advantages can be obtained even in the case where an AC voltage that crosses 0 V is applied to the drive electrode 50.

Figure 12:
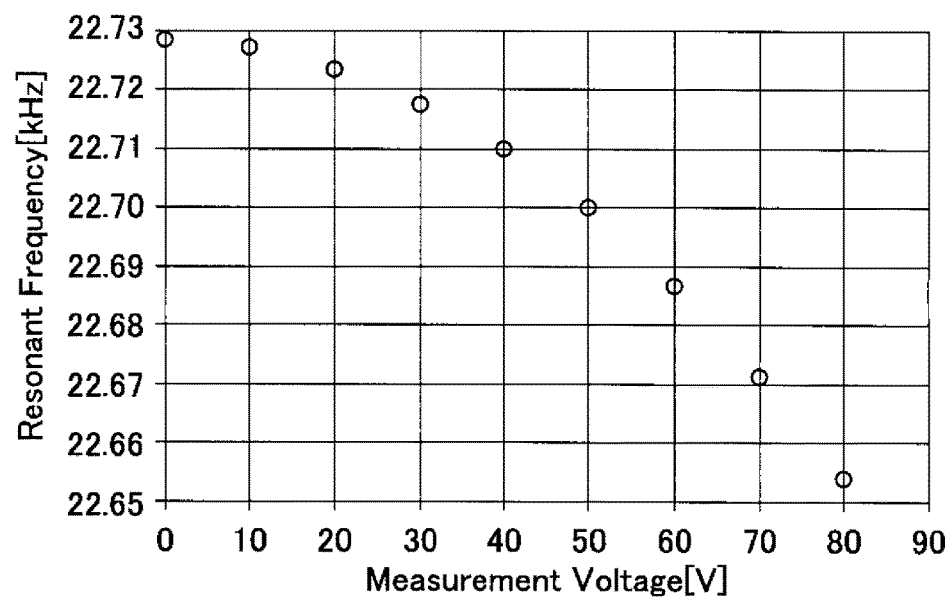
FIG. 12 is a graph showing a correlation between the voltage applied to the fixed electrode and the resonant frequency in a case that an AC voltage having an offset voltage 0 V and a certain 0-V halt period was applied to the drive electrode.

FIG. 12 is a graph showing a correlation between the voltage Vm applied to the fixed electrode 30 and the resonant frequency in a case that an AC voltage having an offset voltage 0 V and a certain 0-V halt period was applied to the drive electrode 50.

As shown in FIG. 12, when an AC voltage that had a certain 0-V halt period and whose time average was 0 V was applied to the drive electrode 50, no measurement result variations were found in each of cases that the voltage Vm applied to the fixed electrode 30 was 0 V, 20 V, 40 V, 50 V, 60 V, and 80 V.

Figure 13:
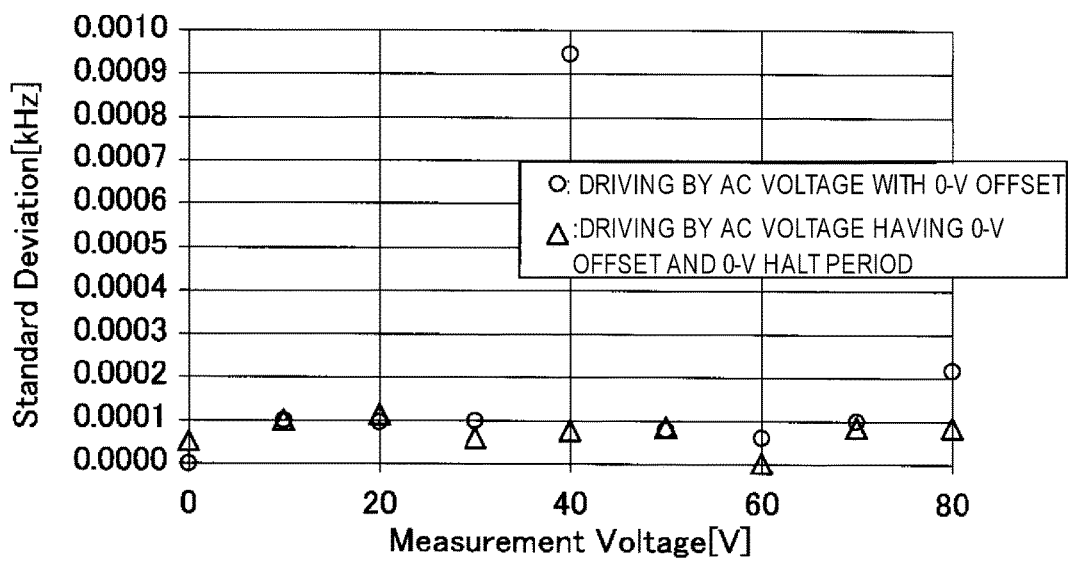
FIG. 13 is a graph showing a correlation between the voltage applied to the fixed electrode and the standard deviation of the resonant frequency in both of the case that the AC voltage with an offset voltage 0 V (no halt period) was applied to the drive electrode and the case that the AC voltage having an offset voltage 0 V and a certain 0-V halt period was applied to the drive electrode.

FIG. 13 is a graph showing a correlation between the voltage Vm applied to the fixed electrode 30 and the standard deviation of the resonant frequency in both of the case that the AC voltage with an offset voltage 0 V (no halt period) was applied to the drive electrode 50 and the case that the AC voltage having an offset voltage 0 V and a certain 0-V halt period was applied to the drive electrode 50.

As described above, in the case of the AC voltage having no halt period, the standard deviation of the resonant frequency was a little lower than 0.0010 kHz when the voltage Vm applied to the fixed electrode 30 was 40 V and was lower than 0.0002 kHz (average: 0.00019 kHz) in each of the other cases that the voltage Vm was 0 V, 20 V, 50 V, 60 V, and 80 V.

On the other hand, in the case of the AC voltage having a halt period, the standard deviation of the resonant frequency was lower than about 0.0001 kHz (average: 0.00007 kHz) in all of the cases that the voltage Vm was 0 V, 20 V, 40 V, 50 V, 60 V, and 80 V.

As described above, the average of the standard deviations of the resonant frequency in the case of the AC voltage having a halt period was smaller than that in the case of the AC voltage having no halt period; that is, the measurement result variations were much smaller in the former case.

As described above, in the voltage sensor 1 according to the embodiment, since an AC voltage whose time average is approximately equal to 0 V is applied to the drive electrode 50, the vibrator 20 is not placed in an electric field that has a single polarity in one direction all the time. Thus, the phenomenon that the effective electric field applied to the vibrator 20 is varied due to charging-up of the vibrator 20 can be suppressed, and hence its influence on the resonant frequency can be prevented. As a result, a fluctuation or a drift of measurement results can be reduced. Furthermore, since a Pockels element, a quarter-wave plate, a polarizer, an analyzer, and other components are not necessary and optical axis alignment etc. need not be carried out, increase of the number of components and complication of assembling work can be prevented. In conclusion, it becomes possible to reduce a fluctuation or a drift of measurement results while preventing increase of the number of components and complication of assembling work.

The AC voltage may be such as to be kept at 0 V every time it reaches 0 V for a prescribed period starting from the time when it reaches 0 V. This further lowers the degree of charging-up of the vibrator 20 and can thereby reduce a fluctuation or a drift of measurement results further.

Although the invention has been described above in the form of the embodiment, the invention is not limited to the embodiment and various modifications are possible without departing from the spirit and scope of the invention.

For example, although in the embodiment the vibrator 20 has a long and narrow shape, the invention is not limited to that case; the vibrator 20 may assume any of other shapes such as a ring shape. That is, the vibrator 20 may have any shape as long as it enables voltage measurement according to the principle of operation shown in FIG. 1. For example, a ring-shaped vibrator may be employed that is vibrated in a wine glass mode.

Although in the embodiment the vibrator 20 and the drive electrode 50 have the comb tooth electrodes 21 and the comb tooth electrodes 51, respectively, the invention is not limited to that case. The vibrator 20 and the drive electrode 50 need not have the comb tooth electrodes 21 and the comb tooth electrodes 51 if the vibrator 20 can be vibrated by generating a sufficiently strong electrostatic attractive force.

What is claimed is:

1. A voltage sensor comprising:
   a vibrator configured to be supported by a mechanical supporting portion and to be given a floating potential;
   a drive electrode configured to be disposed adjacent to the vibrator and to resonate the vibrator with applied AC voltage;
   a driver configured to apply an AC voltage that crosses 0 V to the drive electrode; and
   a fixed electrode configured to be disposed adjacent to the vibrator with a gap formed between the fixed electrode and the vibrator;
   a calculator configured to detect a magnitude of a measurement target voltage based on a change of a resonant frequency of the vibrator when the measurement target voltage is applied to the fixed electrode.

2. The voltage sensor according to claim 1, wherein the driver applies, to the drive electrode, an AC voltage that is kept at 0 V every time the AC voltage reaches 0 V for a prescribed period starting from a time when the AC voltage reaches 0 V.

3. The voltage sensor according to claim 1, wherein the driver applies, to the drive electrode, an AC voltage whose time average over one cycle is approximately equal to 0 V.

4. A voltage sensor comprising:
   a vibrator configured to be supported by a mechanical supporting portion and to be given a floating potential;
   a drive electrode configured to be disposed adjacent to the vibrator and to resonate the vibrator with applied AC voltage;
   a driver configured to apply an AC voltage that crosses 0 V to the drive electrode;

a fixed electrode configured to be disposed adjacent to the vibrator with a gap formed between the fixed electrode and the vibrator; and a calculator configured to detect a magnitude of a measurement target voltage based on a change of a resonant frequency of the vibrator when the measurement target voltage is applied to the fixed electrode, wherein the driver applies, to the drive electrode, an AC voltage that is kept at 0 V every time the AC voltage reaches 0 V for a prescribed period starting from a time when the AC voltage reaches 0 V.

5. A voltage sensor comprising:

a vibrator configured to be supported by a mechanical supporting portion and to be given a floating potential;

a drive electrode configured to be disposed adjacent to the vibrator and to resonate the vibrator with applied AC voltage;

a driver configured to apply an AC voltage that crosses 0 V to the drive electrode;

a fixed electrode configured to be disposed adjacent to the vibrator with a gap formed between the fixed electrode and the vibrator; and a calculator configured to detect a magnitude of a measurement target voltage based on a change of a resonant frequency of the vibrator when the measurement target voltage is applied to the fixed electrode, wherein the driver applies, to the drive electrode, an AC voltage whose time average over one cycle is approximately equal to 0 V.

6. The voltage sensor according to claim 1, wherein the driver is configured to apply an AC voltage having positive portions and negative portions of a same amplitude.

\* \* \* \* \*